United States Patent
Choi

(10) Patent No.: US 9,347,983 B2
(45) Date of Patent: May 24, 2016

(54) WIRING STRUCTURE AND DISPLAY DEVICE INCLUDING THE SAME

(71) Applicant: Samsung Display Co., Ltd., Yongin, Gyeonggi-Do (KR)

(72) Inventor: Sung Young Choi, Hwaseong-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 292 days.

(21) Appl. No.: 13/944,586

(22) Filed: Jul. 17, 2013

(65) Prior Publication Data

US 2014/0167796 A1    Jun. 19, 2014

(30) Foreign Application Priority Data

Dec. 17, 2012  (KR) .......................... 10-2012-0147495

(51) Int. Cl.
*G01R 31/3187*  (2006.01)
*G01R 31/28*  (2006.01)

(52) U.S. Cl.
CPC ................................. *G01R 31/2818* (2013.01)

(58) Field of Classification Search
None
See application file for complete search history.

(56) References Cited

U.S. PATENT DOCUMENTS

2008/0050982 A1* 2/2008 Kaneko .......................... 439/721
2012/0262886 A1* 10/2012 Yamagishi ..................... 361/749

FOREIGN PATENT DOCUMENTS

| KR | 10-2007-0027891 A | 3/2007 |
| KR | 10-2008-0057442 A | 6/2008 |
| KR | 10-2010-0064498 A | 6/2010 |

* cited by examiner

*Primary Examiner* — Paresh Patel
(74) *Attorney, Agent, or Firm* — Robert E. Bushnell, Esq.

(57) ABSTRACT

There is provided a wiring structure comprising a board, which includes a connection pattern, and a plurality of flexible printed circuit boards (FPCBs). Each of the flexible printed circuit boards includes test patterns connected to the connection pattern. The test patterns included in each of the FPCBs are connected to each other by the connection pattern.

13 Claims, 8 Drawing Sheets

US 9,347,983 B2
WIRING STRUCTURE AND DISPLAY DEVICE INCLUDING THE SAME

This application claims priority from Korean Patent Application No. 10-2012-0147495 filed on Dec. 17, 2012 in the Korean Intellectual Property Office, the disclosure of which is incorporated herein by reference in its entirety.

BACKGROUND OF THE INVENTION

1. Field of the Invention

The present invention relates to a wiring structure and a display device including the same, and more particularly, to a wiring structure and a display device, both including flexible printed circuit boards (FPCBs).

2. Description of the Related Art

A flexible printed circuit board (FPCB) may be formed by printing conductive wiring patterns on a flexible insulating film. Being flexible, the FPCB can connect electronic devices including other boards without structural restrictions. Therefore, the FPCB is used in various electronic products. In particular, a display device may include the FPCB to reduce its size. In the display device, the FPCB may connect a display panel to a board in which devices for driving the display panel are disposed. Alternatively, the devices for driving the display panel may be disposed on the FPCB, and the FPCB may be connected to the display panel.

The thickness of the FPCB is limited so that the FPCB can maintain flexibility. Therefore, the FPCB may have low mechanical strength and is likely to be damaged, for example, torn. When the FPCB is torn, wiring patterns formed in the FPCB may be damaged, causing a wiring defect. In addition, the FPCB may be connected to other electronic devices by an anisotropic conductive film (ACF). If the FPCB is connected to other electronic devices by the ACF, it is difficult to judge a connection defect between the FPCB and other electronic devices with the naked eye.

A wiring defect can occur in a wring structure including an FPCB, and it may be difficult to detect the wiring defect. In addition, a plurality of FPCBs can be connected to one board. In this case, it may take a lot of time to test each of the FPCBs for wiring defects.

SUMMARY OF THE INVENTION

Aspects of the present invention provide a wiring structure whose wiring defects can be detected easily.

Aspects of the present invention also provide a wiring structure which can be tested for wiring defects in a reduced time.

Aspects of the present invention also provide a display device whose wiring defects can be detected easily.

Aspects of the present invention also provide a display device which can be tested for wiring defects in a reduced time.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided a wiring structure comprising a board, which comprises a connection pattern, and a plurality of flexible printed circuit boards (FPCBs). Each of the flexible printed circuit boards comprises test patterns connected to the connection pattern. The test patterns included in each of the FPCBs are connected to each other by the connection pattern.

According to another aspect of the present invention, there is provided a wiring structure comprising a first board, which comprises a first connection pattern, a plurality of flexible printed circuit boards connected to the first board, with each of the flexible printed circuit boards comprising test patterns connected to the connection pattern, and a second board connected to the flexible printed circuit boards and comprising a second connection pattern connected to the test patterns. The test patterns included in each of the flexible printed circuit boards are connected to each other by the first connection pattern and the second connection pattern.

According to another aspect of the present invention, there is provided a display device comprising a display panel, a plurality of flexible printed circuit boards connected to the display panel, with each of the flexible printed circuit boards comprising test patterns, and a printed circuit board (PCB) connected to the flexible printed circuit boards and comprising a first connection pattern which is connected to the test patterns. The test patterns included in each of the flexible printed circuit boards are connected to each other by the first connection pattern.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE INVENTION

Figure 1:
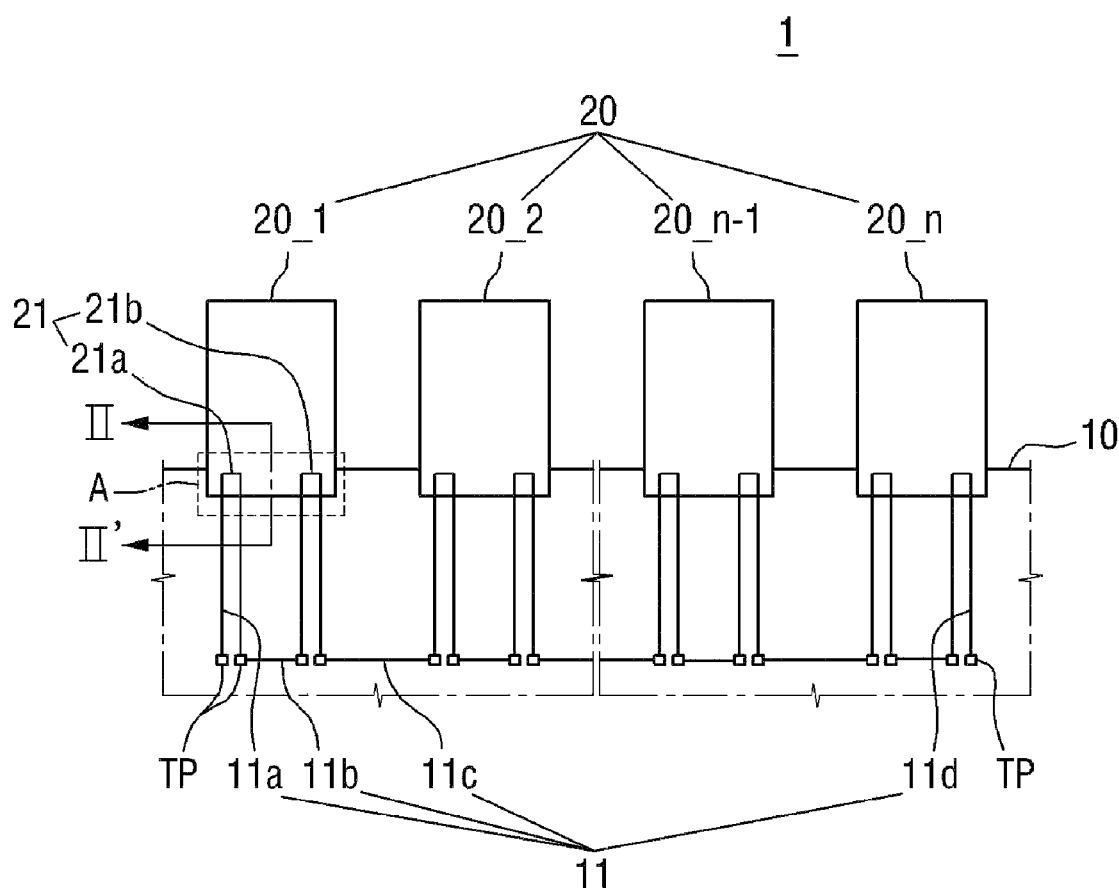
FIG. 1 is a plan view of a wiring structure according to an embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known structures and devices are not shown in order not to obscure the description of the invention with unnecessary detail. Like numbers refer to like elements throughout. In the drawings, the thickness of layers and regions are exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Hereinafter, embodiments of the present invention will be described with reference to the attached drawings.

FIG. 1 is a plan view of a wiring structure 1 according to an embodiment of the present invention. Referring to FIG. 1, the wiring structure 1 includes a board 10 and a plurality of flexible printed circuit boards (FPCBs) 20.

The board 10 may be, but is not limited to, a rigid PCB. The board 10 includes a connection pattern 11. The connection pattern 11 may be connected to test patterns 21 included in the FPCBs 20. The connection pattern 11 may connect the test patterns 21 to each other. For example, the test patterns 21 may include a first test pattern 21a and a second test pattern 21b which are separated from each other. The connection pattern 11 may connect the first test pattern 21a and the second test pattern 21b included in one FPCB 20 or may connect the first test pattern 21a included in one FPCB 20 to the second test pattern 21b included in another FPCB 20 adjacent to the FPCB 20. The connection pattern 11 may connect the test patterns 21 included in each of the FPCBs 20. Since the connection pattern 11 is connected to the test patterns 21 included in each of the FPCBs 20, the connection pattern 11 and the test patterns 21 may form one conductive line. Therefore, a wiring defect in any one of the FPCBs 20 can be detected by measuring the resistance between an end of the conductive line formed by the connection pattern 11 and the test patterns 21 and the other end of the conductive line. That is, in the wiring structure 1 according to the current embodiment, wiring defects can be detected by one test. Therefore, the time required to test the wiring structure 1 for wiring defects can be reduced. This will be described in more detail later.

The connection pattern 11 may include a first end portion 11a, a second end portion 11d, a first connection portion 11b, and a second connection portion 11c.

An end of the first end portion 11a may be connected to a test pattern 21, and the other end of the first end portion 11a may be open. More specifically, an end of the first end portion 11a may be connected to the first test pattern 21a. The first end portion 11a may include a test pad TP. The test pad TP included in the first end portion 11a may be disposed adjacent to the other end of the first end portion 11a. However, the present invention is not limited thereto. Although not shown in the drawing, the board 10 may further include an insulating layer disposed on the connection pattern 11. The insulating layer may not be disposed on the test pad TP, thus exposing a corresponding region of the connection pattern 11. The test pad TP may be formed by expanding a width of the connection pattern 11.

An end of the second end portion 11d may be connected to a test pattern 21, and the other end of the second end portion 11d may be open. More specifically, an end of the second end portion 11d may be connected to the second test pattern 21b. The second end portion 11d may include a test pad TP.

The first end portion 11a and the second end portion 11d may respectively correspond to both ends of one conductive line formed by the connection pattern 11 and the test patterns 21. Therefore, wiring defects between all FPCBs 20 and the board 10 can be detected by measuring the resistance between the test pad TP included in the first end portion 11a and the test pad TP included in the second end portion 11b.

The first connection portion 11b may connect the test patterns 21 included in each of the FPCBs 20. For example, the first connection portion 11b may connect the first test pattern 21a to the second test pattern 21b included in one of the FPCBs 20. The first connection portion 11b may include test pads TP. In FIG. 1, one first connection portion 11b includes two test pads TP. However, the present invention is not limited thereto.

The second connection portion 11c may connect the test patterns 21 included in two of the FPCBs 20. For example, the second connection portion 11c may connect the first test pattern 21a included in one of the FPCBs 20 to the second test pattern 21b included in another FPCB 20. The second connection portion 11c may include test pads TP. In FIG. 1, one second connection portion 11c includes two test pads TP. However, the present invention is not limited thereto.

The FPCBs 20 are connected to the board 10. In FIG. 1, the FPCBs 20 include first through $n^{th}$ FPCBs 20_1 through 20_n. However, the number of the FPCBs 20 is not limited. The FPCBs 20 may be made of a flexible material and can be bent or curved.

Each of the FPCBs 20 includes the test patterns 21. The test patterns 21 are connected to the connection pattern 11. The test patterns 21 included in the FPCBs 20 may be connected to each other by the connection pattern 11. Since the test patterns 21 included in the FPCBs 20 are connected to each other by the connection pattern 11, the test patterns 21 and the connection pattern 11 may form one conductive line. Therefore, defects in the wiring structure 1 can be easily detected by measuring the resistance between both ends of the conductive line.

The test patterns 21 may include the first test pattern 21a and the second test pattern 21b. The first test pattern 21a and the second test pattern 21b may be separated from each other. For example, the first test pattern 21a and the second test pattern 21b may be disposed adjacent to each other on a side of each FPCB 20. In this case, the first test pattern 21a may be disposed adjacent to an end of the side of the FPCB 20, and the second test pattern 21b may be disposed adjacent to the other end of the side of the FPCB 20. In the case where the first test pattern 21a and the second test pattern 21b are disposed adjacent to both ends of the side of the FPCB 20, if the FPCB 20 is torn from a side adjacent to the side of the FPCB 20, the first test pattern 21a or the second test pattern 21b may be damaged. Therefore, whether the FPCB 20 has been torn can be detected easily.

Figure 2:
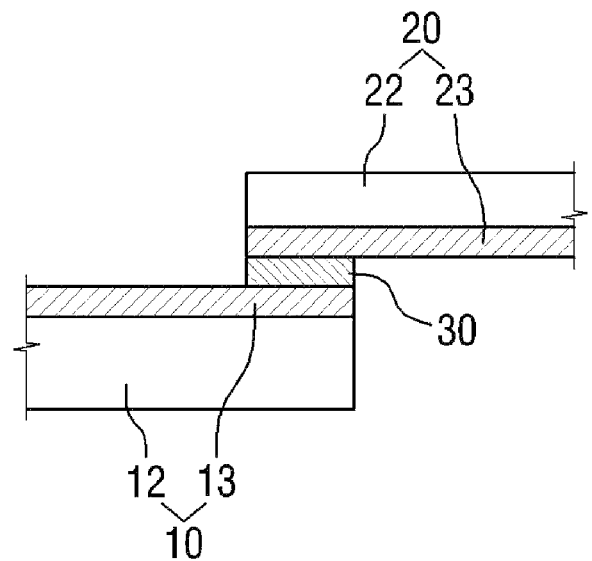
FIG. 2 is a cross-sectional view taken along the line II-II' of FIG. 1.

The wiring structure 1 will now be described in more detail with reference to FIG. 2. FIG. 2 is a cross-sectional view taken along the line II-II' of FIG. 1.

Referring to FIG. 2, the board 10 may include a first substrate 12 and a first wiring layer 13. The first substrate 12 may support other elements of the board 10. The first substrate 12 may be made of an insulating material. For example, the first substrate 12 may be made of, but not limited to, synthetic resin (such as polyethylene terephthalate (PET), polymethylmethacrylate (PMMA), polyethersulfone (PES) and polycarbonate (PC)), glass, or silicon.

The first wiring layer 13 may be disposed on the first substrate 12. The first wiring layer 13 may be made of a conductive material. The first wiring layer 13 may include the connection pattern 11. The first wiring layer 13 may include other wiring patterns in addition to the connection pattern 11. For example, the first wiring layer 13 may include wiring patterns for exchanging signals with the FPCBs 20.

The FPCBs 20 may be placed on the board 10. At least a portion of each of the FPCBs 20 may overlap the board 10. Each of the FPCBs 20 may include a second substrate 22 and a second wiring layer 23. The second substrate 22 may be made of a flexible insulating material. To make the second substrate 22 have flexibility, a thickness of the second substrate 22 may be limited. The second substrate 22 may be made of, but not limited to, synthetic resin such as PET, PMMA, PES and PC.

The second wiring layer 23 may be disposed on the second substrate 22. The second wiring layer 23 may be disposed on a bottom surface of the second substrate 22. At least a region of the second wiring layer 23 may overlap the first wiring layer 13. The second wiring layer 23 may include the test patterns 21. The second wiring layer 23 may include other wiring patterns in addition to the test patterns 21. For example, the second wiring layer 23 may include wiring patterns for exchanging signals with the board 10.

The wiring structure 1 may further include an anisotropic conductive film (ACF) 30. The ACF 30 may be interposed between the board 10 and each of the FPCBs 20. The ACF 30 may electrically connect the board 10 to each of the FPCBs 20. The ACF 30 may connect the first wiring layer 13 and the second wiring layer 23 to each other. The ACF 30 may include a plurality of conductive particles that are distributed. The conductive particles may be connected to each other by the pressure applied to the ACF 30 by the board 10 and each of the FPCBs 20, thereby electrically connecting the first wiring layer 13 and the second wiring layer 23. The connection pattern 11 and the test patterns 21 may be connected to each other by the ACF 30. It is difficult to check, with the naked eye, whether the first wiring layer 13 and the second wiring layer 23 are connected properly by the ACF 30. However, in the wiring structure 1 according to the current embodiment, wiring defects can be detected easily by measuring the resistance between both ends of one conductive line formed by the test patterns 21 and the connection pattern 11. Therefore, whether the first wiring layer 13 and the second wiring layer 23 are connected properly by the ACF 30 can also be detected easily.

Figure 3:
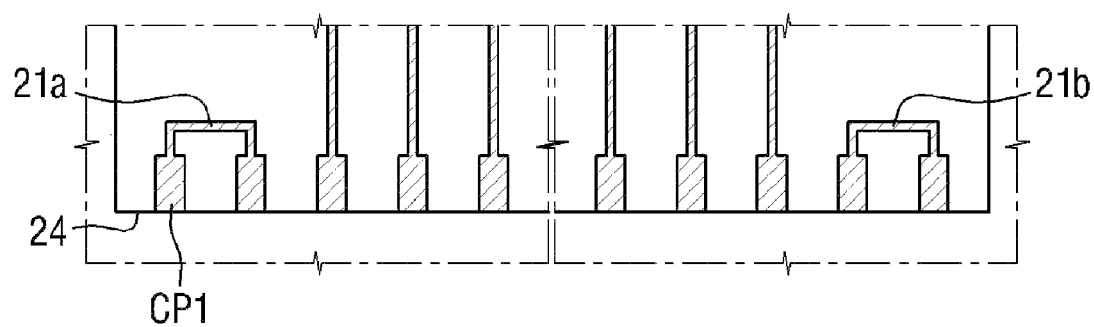
FIG. 3 is an enlarged view of a flexible printed circuit board (FPCB) in a region A of FIG. 1.

The FPCBs 20 will now be described in more detail with reference to FIG. 3. FIG. 3 is an enlarged view of a FPCB 20 in a region A of FIG. 1. While only the first FPCB 20_1 is shown in FIG. 3, descriptions of the second through $n^{th}$ FPCBs 20_2 through 20_n may be substantially identical to a description of the first FPCB 20_1. FIG. 3 may be a bottom view of the first FPCB 20_1 reversed horizontally for ease of description.

Referring to FIG. 3, the first FPCB 20_1 may include a plurality of first connection pads CP1. The first connection pads CP1 may be included in the second wiring layer 23. The first connection pads CP1 may overlap the first wiring layer 13, more specifically, a plurality of second connection pads CP2 (shown in FIG. 4) which will be described later. The first connection pads CP1 may be connected to the second connection pads CP2, respectively. The first connection pads CP1 may be connected respectively to the second connection pads CP2 by the ACF 30. The first connection pads CP1 may be formed adjacent to a side 24 of the first FPCB 20_1.

The first test pattern 21a may be disposed adjacent to an end of the side 24 of the first FPCB 20_1. The first test pattern 21a may connect two first connection pads CP1 disposed adjacent to the end of the side 24 of the first FPCB 20_1. The two first connection pads CP1 connected by the first test pattern 21a may be first connection pads CP1 disposed most adjacent to the end of the side 24 from among the first connection pads CP disposed adjacent to the both sides 24 of the first FPCB 20_1.

The second test pattern 21b may be disposed adjacent to the other end of the side 24 of the first FPCB 20_1. The second test pattern 21b may connect two first connection pads CP1 disposed adjacent to the other end of the side 24 of the first FPCB 20_1. The two first connection pads CP1 connected by the second test pattern 21b may be first connection pads CP1 disposed most adjacent to the other end of the side 24 from among the first connection pads CP disposed adjacent to the side 24 of the first FPCB 20_1.

In a case where the first test pattern 21a and the second test pattern 21b connect the first connection pads CP1 disposed adjacent to both ends of the side 24 of the first FPCB 20_1, if first connection pads CP1 disposed between the first connection pads CP1 which are connected by the first test pattern 21a and the second test pattern 21b are not aligned properly with corresponding second connection pads CP2, the first connection pads CP1 connected to the first test pattern 21a or the second test pattern 21b may also not be aligned properly with corresponding second connection pads CP2. In this case, wiring defects can be detected by measuring the resistance between both ends of a conductive line formed by the test patterns 21 and the connection pattern 11.

Figure 4:
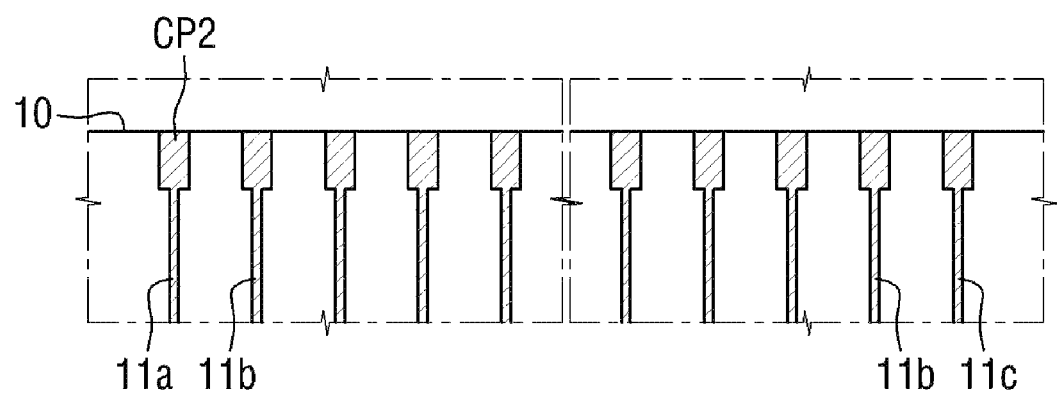
FIG. 4 is an enlarged view of a board in the region A of FIG. 1.

The board 10 will now be described in more detail with reference to FIG. 4. FIG. 4 is an enlarged view of the board 10 in the region A of FIG. 1.

Referring to FIG. 4, the board 10 may include the second connection pads CP2. The second connection pads CP2 may be included in the first wiring layer 13. The second connection pads CP2 may be overlapped by the second wiring layer 23, more specifically, the first connection pads CP1. The second connection pads CP2 may be disposed at positions corresponding to the first connection pads CP1. The second connection pads CP2 may be connected to the first connection pads CP1, respectively. The first end portion 11a may be connected to a second connection pad CP2 which corresponds to the first connection pad CP1 connected to the first test pattern 21a of the first FPCB 20_1. The first connection portion 11b may be connected to a second connection pad CP2 which corresponds to the first connection pad CP1 connected to the first test pattern 21a of the first FPCB 20_1 and a second connection pad CP2 which corresponds to the first connection pad CP1 connected to the second test pattern 21b. The second connection portion 11c may be connected to a second connection pad CP2 which corresponds to the first connection pad CP1 connected to the second test pattern 21b of the first FPCB 20_1 and, although not shown in the drawing, a second connection pad CP2 which corresponds to the first connection pad CP1 connected to the first test pattern 21a of the second FPCB 20_2.

Figure 5:
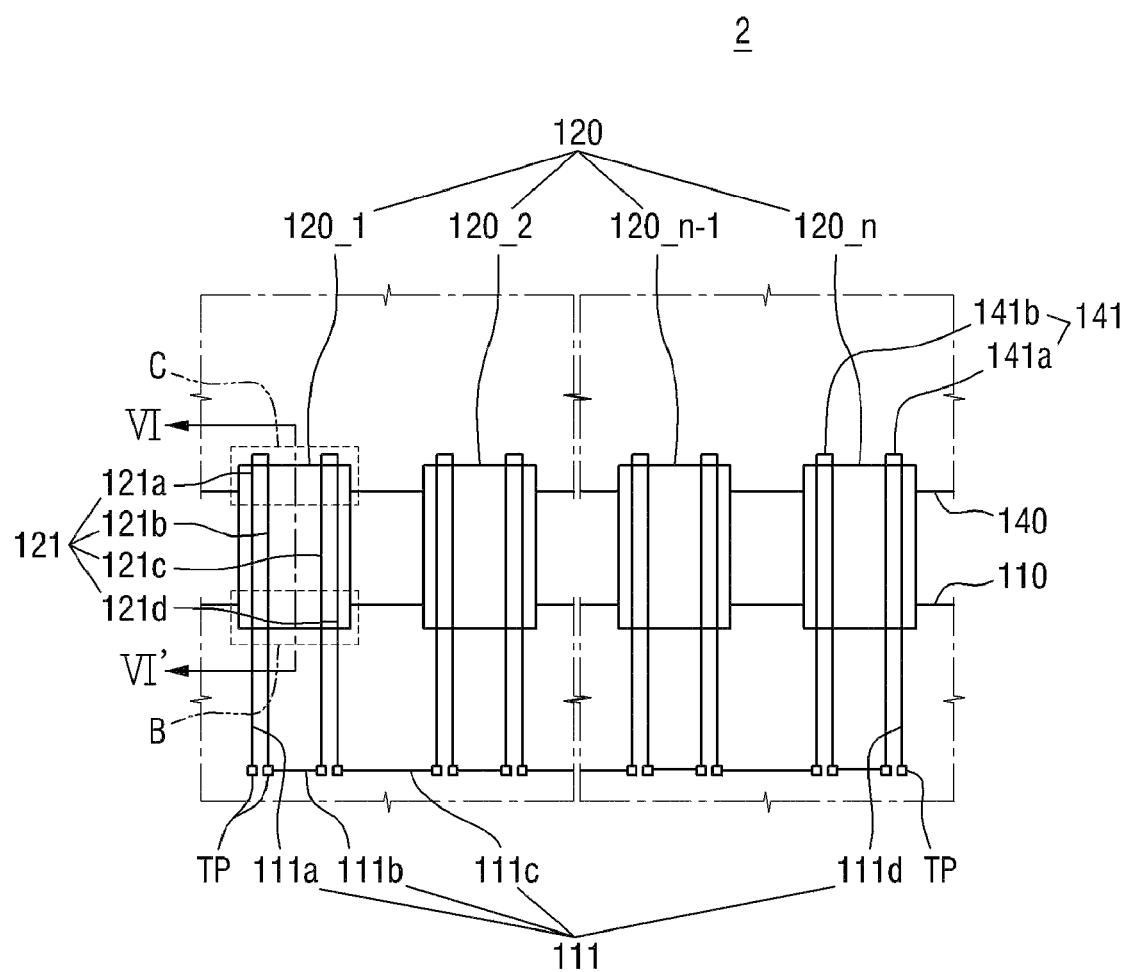
FIG. 5 is a plan view of a wiring structure according to another embodiment of the present invention.

Another embodiment of the present invention will now be described with reference to FIG. 5. FIG. 5 is a plan view of a wiring structure 2 according to another embodiment of the present invention.

Referring to FIG. 5, the wiring structure 2 includes a first board 110, a second board 140, and a plurality of FPCBs 120.

The first board 110 includes a first connection pattern 111. The first connection pattern 111 may be connected to test patterns 121 included in the FPCBs 120. The first connection pattern 111 may connect the test patterns 121 of the FPCBs 120 to each other. The connection pattern 111 may connect the test patterns 121 included in one FPCB 120 or connect a test pattern 121 included in one FPCB 120 to a test pattern 121 included in another FPCB 120. The first connection pattern 111 may be connected to a second connection pattern 141 and the test patterns 121 of the FPCBs 120, thereby forming one conductive line. When any one of the FPCBs 120 has a wiring defect, it can be detected by measuring the resistance between both ends of the conductive line formed by the first connection pattern 111, the second connection pattern 141, and the test patterns 121. Therefore, the time required to test the wiring structure 2 of the present invention for wiring defects can be reduced.

The first connection pattern 111 may include a first end portion 111a, a second end portion 111d, a first connection portion 111b, and a second connection portion 111c.

An end of the first end portion 111a may be connected to a test pattern 121, and the other end of the first end portion 111a may be open. The first end portion 111a may include a test pad TP. The test pad TP included in the first end portion 111a may be disposed adjacent to the other end of the first end portion 111a. However, the present invention is not limited thereto. An end of the second end portion 111d may be connected to a test pattern 121, and the other end of the second end portion 111d may be open. The second end portion 111d may include a test pad TP.

The first end portion 111a and the second end portion 111d may respectively correspond to both ends of one conductive line formed by the connection pattern 111, the second connection pattern 141 and the test patterns 121. Therefore, wiring defects between all FPCBs 120, the first board 110 and the second board 140 can be detected by measuring the resistance between the test pad TP included in the first end portion 111a and the test pad TP included in the second end portion 111b.

The first connection portion 111b may connect the test patterns 121 included in one of the FPCBs 120. The second connection portion 111c may connect the test patterns 121 included in two of the FPCBs 120.

The FPCBs 120 are connected to the first board 110 and the second board 140. The FPCBs 120 may include first through nth FPCBs 120_1 through 120_n. Each of the FPCBs 120 includes the test patterns 121. The test patterns 121 are connected to the first connection pattern 111 and the second connection pattern 141. The test patterns 121 included in the FPCBs 120 may be connected to each other by the first connection pattern 111 and the second connection pattern 141.

The test patterns 121 may include first through fourth test patterns 121a through 121d. The first through fourth test patterns 121a through 121d may be arranged sequentially. The first test pattern 121a and the second test pattern 121b may be disposed adjacent to each other. The third test pattern 121c and the fourth test pattern 121d may be disposed adjacent to each other. The first test pattern 121a and the second test pattern 121b may be connected to each other by the second connection pattern 141. The second test pattern 121b and the third test pattern 121c may be connected to each other by the first connection portion 111b. The third test pattern 121c and the fourth test pattern 121d may be connected to each other by the second connection pattern 141. The fourth test pattern 121d included in one FPCB 120 may be connected to the first test pattern 121a included in another adjacent FPCB 120 by the second connection portion 111c or may be connected to the second end portion 111d. The first test pattern 121a included in one FPCB 120 may be connected to the fourth test pattern 121d included in another adjacent FPCB 120 by the second connection portion 111c or may be connected to the first end portion 111a.

The first test pattern 121a may be disposed adjacent to one of two sides of each FPCB 120 which do not overlap the first board 110 or the second board 140, and the fourth test pattern 121d may be disposed adjacent to the other one of the two sides of the FPCB 120. The two sides of the FPCB 120 which do not overlap the first board 110 or the second board 140 can be torn. In this case, the first test pattern 121a or the fourth test pattern 121d is damaged. Therefore, the damage to the FPCB 120 can be detected easily.

The second board 140 is connected to the FPCBs 120. The second board 140 includes the second connection pattern 141. The second connection pattern 141 may connect the test patterns 121 to each other. More specifically, the second connection pattern 141 may connect the test patterns 121 included in one of the FPCBs 120.

The second connection pattern 141 may include a third connection portion 141a and a fourth connection portion 141b. The third connection portion 141a may connect the first test pattern 121a and the second test pattern 121b to each other. The fourth connection portion 141b may connect the third test pattern 121c and the fourth test pattern 121d to each other.

As described above, one conductive line formed by the first connection pattern 111, the second connection pattern 141 and the test patterns 121 passes through the first board 110, the FPCBs 120, and the second board 140. Therefore, wiring defects between the first board 110 and the FPCBs 120 and wiring defects between the FPCBs 120 and the second board 140 can be detected at a time by measuring the resistance between both ends of the conductive line.

Figure 6:
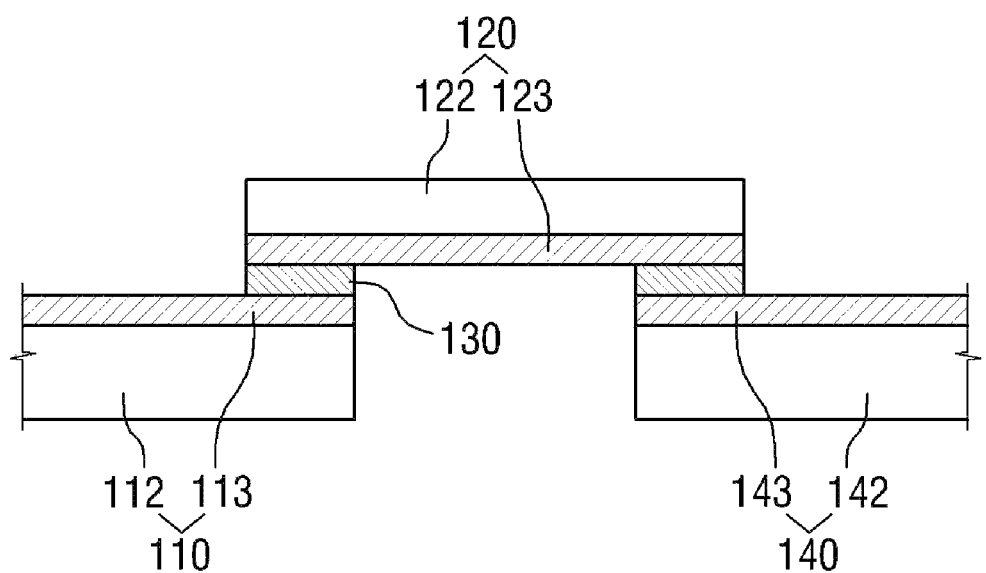
FIG. 6 is a cross-sectional view taken along the line VI-VI' of FIG. 5.

The wiring structure 2 will now be described in more detail with reference to FIG. 6. FIG. 6 is a cross-sectional view taken along the line VI-VI' of FIG. 5.

Referring to FIG. 6, the first board 110 may include a first substrate 112 and a first wiring layer 113. The first wiring layer 113 may include the first connection pattern 111. The first wiring layer 113 may include other wiring patterns in addition to the first connection pattern 111. For example, the first wiring layer 113 may include wiring patterns for exchanging signals with the FPCBs 120.

The FPCBs 120 may be placed on the first board 110 and the second board 140. At least a portion of each of the FPCBs 120 may overlap the first board 110 and the second board 140. Each of the FPCBs 120 may include a second substrate 122 and a second wiring layer 123.

At least a region of the second wiring layer 123 may overlap the first wiring layer 113 and a third wiring layer 143 which will be described later. The second wiring layer 123 may include the test patterns 121. The second wiring layer 123 may include other wiring patterns in addition to the test patterns 121. For example, the second wiring layer 123 may include wiring patterns for exchanging signals with the first board 110 and the second board 140.

The second board 140 may be overlapped by at least a portion of each of the FPCBs 120. The second board 140 may include a third substrate 142 and the third wiring layer 143. The third wiring layer 143 may include the second connection pattern 141. The third wiring layer 143 may include other wiring patterns in addition to the second connection pattern 141. For example, the third wiring layer 143 may include wiring patterns for exchanging signals with the FPCBs 120.

The wiring structure 2 may further include an ACF 130. The ACF 130 may be interposed between the first board 110 and each of the FPCBs 120 and between the second board 140 and each of the FPCBs 120. The ACF 130 may electrically connect the first board 110 to each of the FPCBs 120 and may electrically connect the second board 140 to each of the FPCBs 120. The ACF 130 may connect the first wiring layer 113, the second wiring layer 123, and the third wiring layer 143 to each other.

Figure 7:
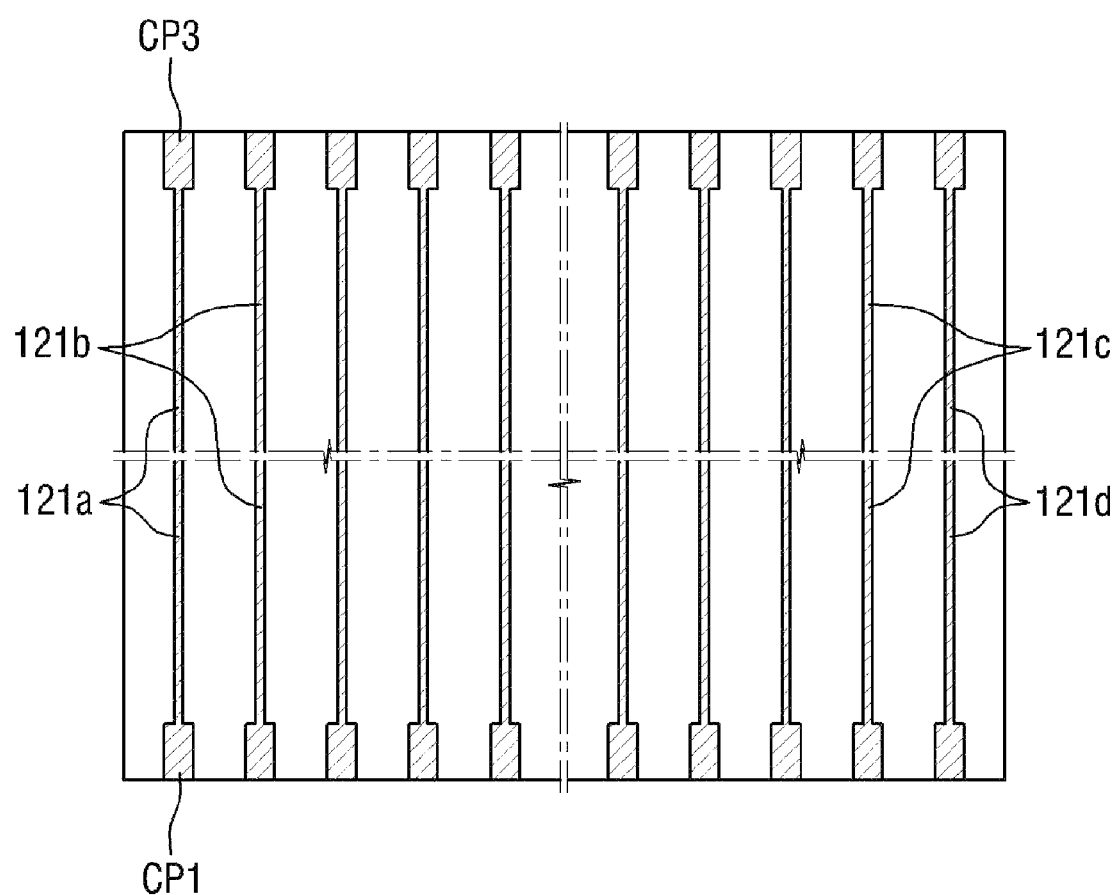
FIG. 7 is an enlarged view of a first FPCB shown in FIG. 5.

The FPCBs 120 will now be described in more detail with reference to FIG. 7. FIG. 7 is an enlarged view of the first FPCB 120_1 shown in FIG. 5. While only the first FPCB 120_1 is shown in FIG. 7, descriptions of the second through nth FPCBs 120_2 through 120_n may be substantially identical to a description of the first FPCB 120_1. FIG. 7 may be a bottom view of the first FPCB 120_1 reversed horizontally for ease of description.

Referring to FIG. 7, the first FPCB 120_1 may include a plurality of first connection pads CP1 and a plurality of third connection pads CP3. The first connection pads CP1 may be disposed adjacent to a side of the first FPCB 120_1 which overlaps the first board 110. The first connection pads CP1 may be included in the second wiring layer 123. The first connection pads CP1 may overlap the first wiring layer 113, more specifically, a plurality of second connection pads CP2 which will be described later. The first connection pads CP1 may be connected to the second connection pads CP2, respectively.

The third connection pads CP3 may be disposed adjacent to a side of the first FPCB 120_1 which overlaps the second board 140. The third connection pads CP3 may be included in the second wiring layer 123. The third connection pads CP3 may overlap the third wiring layer 143, more specifically, a plurality of fourth connection pads CP4 (shown in FIG. 9) which will be described later. The third connection pads CP3 may be connected to the fourth connection pads CP4, respectively.

The first test pattern 121*a* and the second test pattern 121*b* may connect the first connection pads CP1 and the third connection pads CP3 which are disposed adjacent to one (hereinafter, referred to as a first side) of two sides of the first FPCB 120_1 which do not overlap the first board 110 and the second board 140. The first connection pad CP1 connected to the first test pattern 121*a* may be a first connection pad CP most adjacent to the first side from among the first connection pads CP1. The first connection pad CP1 connected to the second test pattern 121*a* may be a first connection pad CP1 neighboring the first connection pad CP1 connected to the first test pattern 121*a*. The third connection pad CP3 connected to the first test pattern 121*a* may be a third connection pad CP3 most adjacent to the first side from among the third connection pads CP3. The third connection pad CP3 connected to the second test pattern 121*a* may be a third connection pad CP3 neighboring the third connection pad CP3 connected to the first test pattern 121*a*.

The third test pattern 121*c* and the fourth test pattern 121*d* may connect the first connection pads CP1 and the third connection pads CP3 which are disposed adjacent to the other one (hereinafter, referred to as a second side which is opposite the first side to which the first test pattern 121*a* and the second test pattern 121*b* are disposed adjacent) of the two sides of the first FPCB 120_1 which do not overlap the first board 110 and the second board 140. The first connection pad CP1 connected to the fourth test pattern 121*d* may be a first connection pad CP1 most adjacent to the second side from among the first connection pads CP1. The first connection pad CP1 connected to the third test pattern 121*c* may be a first connection pad CP1 neighboring the first connection pad CP1 connected to the fourth test pattern 121*d*. The third connection pad CP3 connected to the fourth test pattern 121*d* may be a third connection pad CP3 most adjacent to the second side from among the third connection pads CP3. The third connection pad CP3 connected to the third test pattern 121*c* may be a third connection pad CP3 neighboring the third connection pad CP3 connected to the fourth test pattern 121*d*.

Figure 8:
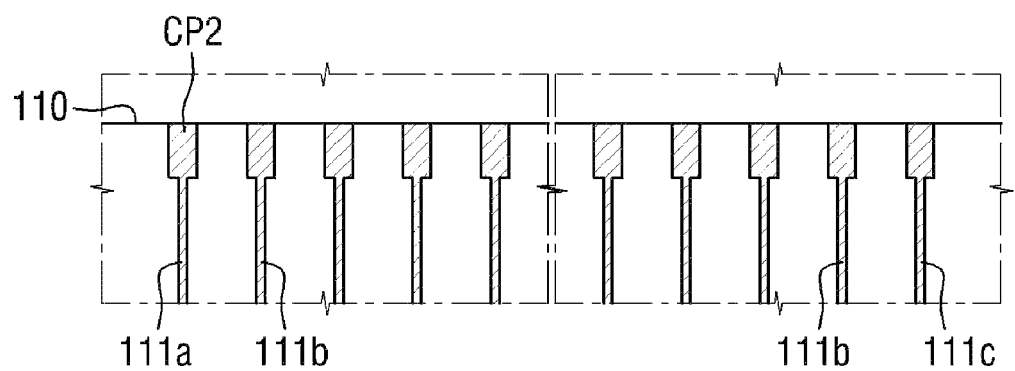
FIG. 8 is an enlarged view of a first board in a region B of FIG. 5.

The first board 110 will now be described in more detail with reference to FIG. 8. FIG. 8 is an enlarged view of the first board 110 in a region B of FIG. 5.

Referring to FIG. 8, the first board 110 may include the second connection pads CP2. The second connection pads CP2 may be included in the first wiring layer 113. The second connection pads CP2 may be overlapped by the second wiring layer 123, more specifically, the first connection pads CP1. The second connection pads CP2 may be disposed at positions corresponding to the first connection pads CP1. The second connection pads CP2 may be connected to the first connection pads CP1, respectively. The first end portion 111*a* may be connected to a second connection pad CP2 which corresponds to the first connection pad CP1 connected to the first test pattern 121*a* of the first FPCB 120_1. The first connection portion 111*b* may be connected to a second connection pad CP2 which corresponds to the first connection pad CP1 connected to the second test pattern 121*b* of the first FPCB 120_1 and a second connection pad CP2 which corresponds to the first connection pad CP1 connected to the third test pattern 121*c*. The second connection portion 111*c* may be connected to a second connection pad CP2 which corresponds to the first connection pad CP1 connected to the fourth test pattern 121*d* of the first FPCB 120_1 and, although not shown in the drawing, a second connection pad CP2 which corresponds to the first connection pad CP1 connected to the first test pattern 121*a* of the second FPCB 120_2.

Figure 9:
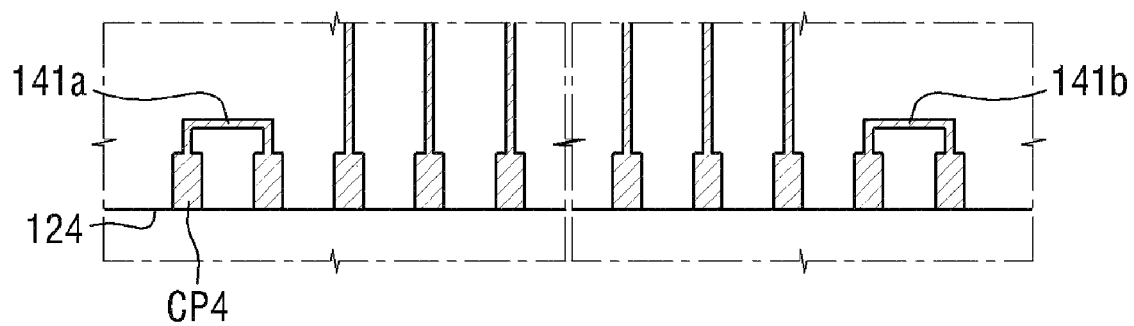
FIG. 9 is an enlarged view of a second board in a region C of FIG. 5.

The second board 140 will now be described in more detail with reference to FIG. 9. FIG. 9 is an enlarged view of the second board 140 in a region C of FIG. 5.

Referring to FIG. 9, the second board 140 may include the fourth connection pads CP4. The fourth connection pads CP4 may be included in the third wiring layer 143. The fourth connection pads CP4 may be overlapped by the second wiring layer 123, more specifically, the third connection pads CP3. The third connection portion 141*a* may be connected to a fourth connection pad CP4 which corresponds to the third connection pad CP3 connected to the first test pattern 121*a* of the first FPCB 120_1 and a fourth connection pad CP4 which corresponds to the third connection pad CP3 connected to the second test pattern 121*b*. The fourth connection portion 141*b* may be connected to a fourth connection pad CP4 which corresponds to the third connection pad CP3 connected to the third test pattern 121*c* of the first FPCB 120_1 and, although not shown in the drawing, a fourth connection pad CP4 which corresponds to the third connection pad CP3 connected to the fourth test pattern 121*d*.

Figure 10:
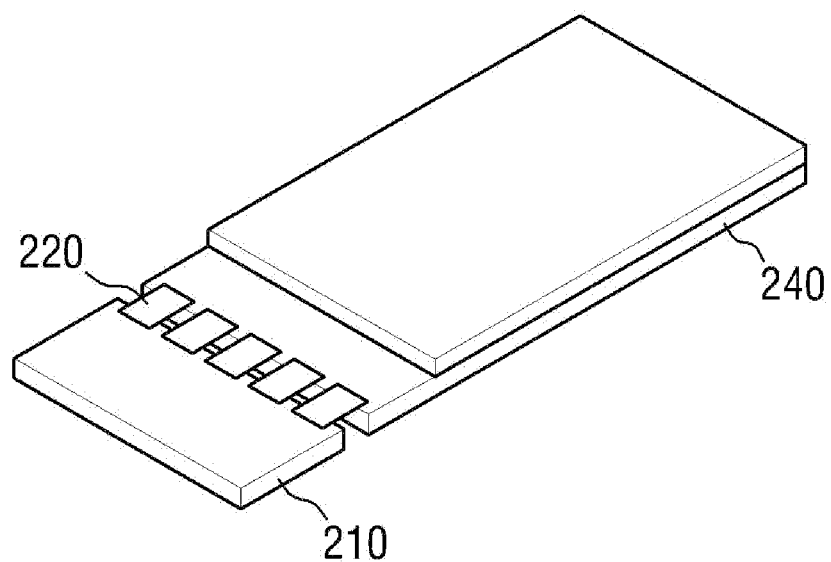
FIG. 10 is a perspective view of a display device according to another embodiment of the present invention.

Another embodiment of the present invention will now be described with reference to FIG. 10. FIG. 10 is a perspective view of a display device 3 according to another embodiment of the present invention.

Referring to FIG. 10, the display device 3 includes a PCB 210, a plurality of FPCBs 220, and a display panel 240.

The display panel 240 may vary according to the type of the display device 3. For example, the display panel 240 may be, but is not limited to, an organic electroluminescence display panel, a liquid crystal display panel, an electrophoretic display panel, or a plasma display panel. The display panel 240 may be connected to the FPCBs 220. The display panel 240 may receive signals for driving the display panel 240 through the FPCBs 220.

The FPCBs 220 may be connected to the display panel 240 and the PCB 210. The FPCBs 220 may function as a path for exchanging signals between the PCB 210 and the display panel 240. According to some embodiments, although not shown in the drawing, devices for driving the display panel 240 may be disposed on the FPCBs 220.

The PCB 210 is connected to the FPCBs 220. The PCB 210 may generate signals for driving the display panel 240 and transmit the generated signals to the display panel 240 through the FPCBs 220. The PCB 210 may include devices (not shown) for driving the display panel 240.

Although not shown in the drawing, the display device 3 may further include an ACF. The ACF may be interposed between the FPCBs 220 and the PCB 210 and between the FPCBs 220 and the display panel 240, thereby electrically connecting the FPCBs 220 to the PCB 210 and the display panel 240.

The display device 3 may include the wiring structure 1 of FIG. 1. If the display device 3 includes the wiring structure 1 of FIG. 1, the PCB 210 may correspond to the board 10 of the wiring structure 1, and the FPCBs 220 may correspond to the FPCBs 20 of the wiring structure 1. According to some embodiments, the display panel 240 may correspond to the board 10 of the wiring structure 1, and the FPCBs 220 may correspond to the FPCBs 20 of the wiring structure 1.

According to another embodiment, the display device 3 may include the wiring structure 2 of FIG. 5. If the display device 3 includes the wiring structure 2 of FIG. 5, the PCB 210 may correspond to the first board 110 of the wiring structure 2, the FPCBs 220 may correspond to the FPCBs 120 of the wiring structure 2, and the display panel 240 may correspond to the second board 140. According to some embodiments, the PCB 210 may correspond to the second board 140 of the wiring structure 2, the FPCBs 220 may correspond to the FPCBs 120 of the wiring structure 2, and the display panel 240 may correspond to the first board 110.

While a case where the display device 3 includes the wiring structure 1 of FIG. 1 or the wiring structure 2 of FIG. 5 has been described above with reference to FIG. 10, the wiring structure 1 of FIG. 1 and the wiring structure 2 of FIG. 5 are applicable to various electronic products other than display devices. For example, the wiring structure 1 of FIG. 1 and the wiring structure 2 of FIG. 5 can be applied to an X-ray detector. If the X-ray detector includes the wiring structure 1 of FIG. 1 or the wiring structure 2 of FIG. 5, an X-ray detection panel may correspond to the display panel 240 of the display device 3, a board for driving the X-ray detection panel may correspond to the PCB 210 of the display device 3, and a plurality of FPCBs which connect the X-ray detection panel and the board for driving the X-ray detection panel may correspond to the FPCBs 220 of the display device 3. The above case where the wiring structure 1 of FIG. 1 or the wiring structure 2 of FIG. 5 is applied to the X-ray detector is merely an example.

Embodiments of the present invention provide at least one of the following advantages. That is, wiring defects of a wiring structure or a display device including FPCBs can be detected easily. In addition, the time required to test a wiring structure or a display device including FPCBs for wiring defects can be reduced. However, the effects of the present invention are not restricted to the one set forth herein. The above and other effects of the present invention will become more apparent to one of daily skill in the art to which the present invention pertains by referencing the claims.

What is claimed is:

1. A wiring structure comprising:
a board comprising a connection pattern; and
a plurality of flexible printed circuit boards (FPCBs), each of the flexible printed circuit boards comprising test patterns connected to the connection pattern, the test patterns included in the each of the flexible printed circuit boards being connected to each other by the connection pattern; the test patterns comprising a first test pattern and a second test pattern which are separated from each other, the first connection pattern comprising:
a second connection portion which connects the first test pattern of one of the flexible printed circuit boards to the second test pattern of another of the flexible printed circuit boards; and
a first connection portion which connects the first test pattern and the second test pattern included in the same flexible printed circuit board.

2. The wiring structure of claim 1, wherein the first connection portion comprises test pads.

3. The wiring structure of claim 1, wherein the first test pattern and the second test pattern are disposed adjacent to a side of each of the flexible printed circuit boards, wherein the first test pattern is disposed adjacent to a first end of the side, and the second test pattern is disposed adjacent to a second end of the side.

4. The wiring structure of claim 3, wherein each of the flexible printed circuit boards comprises a plurality of connection pads disposed adjacent to the side of said each of the flexible printed circuit boards, wherein the first test pattern connects two connection pads disposed adjacent to the first end of the side, and the second test pattern connects two connection pads disposed adjacent to the second end of the side.

5. The wiring structure of claim 1, further comprising an anisotropic conductive film (ACF) interposed between the board and each of the flexible printed circuit boards.

6. The wiring structure of claim 1, wherein the connection pattern comprises first and second end portions, each having an end which is connected to a test pattern and the other end which is open, wherein each of the first and second end portions comprises a test pad.

7. A wiring structure comprising:
a first board comprising a first connection pattern;
a plurality of flexible printed circuit boards (FPCBs) connected to the first board, each of the flexible printed circuit boards comprising test patterns connected to the connection pattern, the test patterns comprising first through fourth test patterns which are separated from each other and are arranged sequentially, the first test pattern and the second test pattern disposed adjacent to each other, the third test pattern and the fourth test pattern disposed adjacent to each other, the first connection pattern comprising:
a second connection portion which connects the first test pattern of one of the flexible printed circuit boards to the fourth test pattern of another of the flexible printed circuit boards; and a first connection portion which connects the second test pattern and the third test pattern included in the same flexible printed circuit board; and a second board connected to the flexible printed circuit boards and comprising a second connection pattern connected to the test patterns, the test patterns included in the each of the flexible printed circuit boards being connected to each other by the first connection pattern and the second connection pattern.

8. The wiring structure of claim 7, wherein the second connection pattern connects the first test pattern to the second test pattern, and connects the third test pattern to the fourth test pattern.

9. The wiring structure of claim 7, further comprising an anisotropic conductive film interposed between the first board and each of the flexible printed circuit board and between the second board and each of the flexible printed circuit board.

10. The wiring structure of claim 7, wherein the first connection pattern comprises first and second end portions, each having an end which is connected to a test pattern and the other end which is open, wherein each of the first and second end portions comprises a test pad.

11. A display device comprising:
a display panel;
a plurality of flexible printed circuit boards (FPCBs) connected to the display panel, each of the flexible printed circuit boards comprising test patterns; and
a printed circuit board (PCB) connected to the flexible printed circuit boards and comprising a first connection pattern which is connected to the test patterns, the test patterns included in the each of the flexible printed circuit boards being connected to each other by the first connection pattern, the test patterns comprising a first test pattern and a second test pattern which are separated from each other, the first connection pattern comprising:
a second connection portion which connects the first test pattern of one of the flexible printed circuit boards to the second test pattern of another of the flexible printed circuit boards; and
a first connection portion which connects the first test pattern and the second test pattern included in the same flexible printed circuit board.

12. The display device of claim 11, wherein the display panel comprises a second connection pattern connected to the test patterns.

13. The display device of claim 12, wherein the test patterns comprise first through fourth test patterns which are separated from each other and are arranged sequentially, wherein the first test pattern and the second test pattern are adjacent to each other, and the third test pattern and the fourth test pattern are adjacent to each other, the second connection pattern connects the first test pattern to the second test pattern, and connects the third test pattern to the fourth test pattern, the first connection pattern comprising:
a second connection portion which connects the first test pattern of one of the flexible printed circuit boards to the fourth test pattern of another of the flexible printed circuit boards; and
a first connection portion which connects the second test pattern and the third test pattern included in one flexible printed circuit boards.

* * * * *